US006941502B2

(12) United States Patent
Rushton

(10) Patent No.: US 6,941,502 B2
(45) Date of Patent: Sep. 6, 2005

(54) ERROR DETECTION AND CORRECTION

(75) Inventor: Nigel Kevin Rushton, Bristol (GB)

(73) Assignee: Hewlett-Packard Development Company, L.P., Houston, TX (US)

( * ) Notice: Subject to any disclaimer, the term of this patent is extended or adjusted under 35 U.S.C. 154(b) by 359 days.

(21) Appl. No.: 09/984,976

(22) Filed: Oct. 31, 2001

(65) Prior Publication Data

US 2002/0059548 A1 May 16, 2002

(30) Foreign Application Priority Data

Oct. 31, 2000 (GB) .............................................. 0026624

(51) Int. Cl.[7] .............................................. H03M 13/00
(52) U.S. Cl. .............................................. 714/755
(58) Field of Search ................................ 714/755, 752, 714/758, 786, 572

(56) References Cited

U.S. PATENT DOCUMENTS 4,646,301 A * 2/1987 Okamoto et al. ........... 714/755
5,960,010 A * 9/1999 Liu et al. .................... 714/786

* cited by examiner

*Primary Examiner*—Shelly Chase

(57) ABSTRACT

Data are detected and corrected with first and second error detecting and correcting stages. The first stage error detection and correction capabilities are determined by the number of errors it can detect and correct in a predetermined length data stream. The first stage determines the number of known and unknown data stream errors, corrects errors within its capability, and outputs to the second stage error states relative to the data stream. One state indicates no known data stream errors or first stage data stream correction being attained with less than first stage capability. Another state indicates the number of data stream errors exceeds the predetermined capability, resulting in failure to make the correction. A third state indicates correction of all data stream errors using all the first stage capability.

20 Claims, 3 Drawing Sheets

ERROR DETECTION AND CORRECTION

FIELD OF THE INVENTION

This invention relates to error detection and correction, and in particular error detection and correction in a digital data decoding application.

There are many different applications in which analogue data, such as speech or music, is required to be converted into digital data format and encoded for recording on, for example, a tape or the like. When the analogue data is required to be retrieved, the recorded digital data must be decoded and converted back to its original analogue format for output.

Once the analogue data has been converted into digital format, it is divided into a plurality of blocks of, for example, 28 symbols $a_0 \ldots a_{27}$, and a predetermined number, for example, 4 parity symbols $p_0 \ldots p_3$ are added. The parity symbols are computed from the block symbols in accordance with one of a plurality of known prescribed encoding rules which determine the mathematical structure of the code word 10 made up of the block of 28 symbols 12 and the 4 parity symbols 14, as shown in FIG. 1 of the drawings.

The data at this stage can be considered in terms of a plurality of code words 10 arranged in a column. The data is then divided into C1 blocks, with each C2 block 18 consisting of one or more symbols 16 from each of a plurality of the code words 10, and parity symbols 20 are added to each of the C1 blocks, as shown in FIG. 2 of the drawings. The data is then recorded to, for example, a tape. This is known as interleaving.

When it is required to retrieve the recorded data, it must first be decoded. The decoding process includes an error detection and correction function, which will now be discussed.

The mathematical structure of a code word can be expressed as:

$$f(a_0 \ldots a_{n-1}, p_0 \ldots p_{m-1})$$

In the case where there are four parity symbols in each code word, the above function would give rise to four simultaneous equations, for each code word, which can be used to detect and correct errors in that code word.

When the data is being decoded, it is input to a first error correction module, which detects and corrects errors in the C1 code words (ECC1). If there is an error in a code word, there are two unknown elements: its location, and the amount by which the symbol in question is incorrect. A maximum of four unknown elements can be calculated using four simultaneous equations, so the ECC1 module can detect and correct a maximum of two errors in each code word.

However, in the case where the location of an error in a code word is known, there is only one unknown element: the amount by which the symbol in question is incorrect. Thus, the ECC1 module can correct four such errors. The term used to describe an error whose location is known is an "erasure", and this term will be used as such in the rest of this specification. Thus, in the case where a code word has four parity symbols, the error correction module can detect and correct two errors or correct four erasures.

Referring now to FIG. 3 of the drawings, and as stated above, when data is being decoded or read from the storage medium (not shown), it is input to a first error correction module 32 (ECC1) which detects and corrects errors in the C1 code words. First, it identifies which, if any, of the symbols in a code word are marked as erasures. (In general, each symbol includes an erasure flag which is set to 1 if the symbol is to be marked as an erasure). If there are four or less erasures, the ECC1 module 32 corrects the symbols in question and the data is then input to a second error correction module 34 (ECC2) together with data indicating that the code word is "good". If there are five or more erasures (or, in the absence of any erasures, more than two errors), the ECC1 module cannot correct the erasures/errors and simply inputs the data unchanged to the ECC2 module, together with data indicating that the code word is "bad", thereby indicating to the ECC2 module that a code word contains errors which have not been corrected.

BACKGROUND OF THE INVENTION

The ECC2 module 34 calculates and solves the simultaneous equations for each C2 code word, detecting and/or correcting errors/erasures where it can. As explained above, if the location of errors is known, the error correction module can correct twice as many errors as if the location is not known. However, if a C1 code word input to the ECC1 module 32 is marked with three or four erasures, it uses all or virtually all of its error detecting/correcting capacity in correcting those erasures, whereas if the code word is marked with two or less erasures, the error correction module can use the remaining error detecting/correcting capacity to detect and correct or mark as erasures other errors in the code word. Thus, in the case of a C1 code word having four erasures, the ECC1 module corrects the four erasures and inputs the data to the ECC2 module (with all of the erasure flags set to '0'), together with data indicating that the code word is "good", and when the symbols of that C1 code word are checked by the ECC2 module relative to the associated C2 code words, they are presumed to be correct, whereas they have not been checked at all.

SUMMARY OF THE INVENTION

In accordance with a first aspect of the present invention, there is provided apparatus for detecting and/or correcting data, the apparatus including a first error detecting and/or correcting stage which is arranged to receive a data stream of a predetermined length and to output data to a second error correcting stage indicative of an error state relative to said data stream, said error state being one of at least three possible states, at least one of said possible states indicating that said data stream is "bad" and at least two of the remaining states indicating that said data stream is "good" together with a value of probability of confidence that said data stream is "good".

In accordance with a second aspect of the present invention, there is provided apparatus for detecting and/or correcting data, the apparatus including a second error correcting stage arranged to receive data from a first error detecting and/or correcting stage, said data being indicative of an error state relative to a data stream of a predetermined length, said error state being one of at least three possible states, at least one of said possible states indicating that said data stream is "bad" and at least two of the remaining states indicating that said data stream is "good" together with a value of probability or confidence that said data stream is "good", said second error correcting stage being arranged to perform a correction operation on said data stream dependent on said error state The present invention extends to methods of detecting and/or correcting data corresponding to the first and second aspects of the present invention.

In accordance with one specific exemplary embodiment of the present invention, there is provided apparatus for detecting and/or correcting data, the apparatus comprising a first error detecting and/or correcting stage having a predetermined error detection and/or correction capability determined by the number of errors it can detect and/or correct in a data stream of predetermined length, and a second error correcting stage for receiving data from said first error detecting and/or correcting stage, said first error detecting and/or correcting stage being arranged to receive a data stream of predetermined length, determine the number of known errors in said data stream and correct any such known errors if it is possible within said error detection and/or correction capability, detect and/or correct any unknown errors if it is possible within said error detection and/or correction capability, and output data providing an indication to said second error detection and/or correction stage of an error state relative to said data stream, said error state being one of a plurality of states at least including a first state indicating that there are no known errors in said data stream or that the first error correcting and/or detecting stage has corrected all known errors in the data stream using less than said predetermined error correction and/or detection capability, a second state indicating that the number of errors in the data stream exceeds said predetermined error detection and/or correction capability and could not be corrected, and a third state indicating that all known errors in the data stream have been corrected using substantially all of said predetermined error detection and/or correction capability.

Also in accordance with a specific exemplary embodiment of the present invention, there is provided a method of detecting and/or correcting data, comprising the steps of providing a first error detecting and/or correcting stage having a predetermined error detection and/or correction capability determined by the number of errors it can detect and/or correct in a data stream of a predetermined length, inputting data to said first error detecting and/or correcting stage for correction of any known errors and/or detection and/or correction of any unknown errors within said predetermined error detection and/or correction capability, providing a second error correcting stage for receiving data from said first error detecting and/or correcting stage, said first error detecting and/or correcting stage including means for providing an indication to said second error correcting stage of an error state relative to said data stream, said error state being one of a plurality of states including a first state indicating that there are no known errors in said data stream or that all known errors have been corrected using less than said predetermined error detection and/or correction capability, a second state indicating that the number of errors in the data stream exceeds said predetermined error detection and/or correction capability, and a third state indicating that the known errors in said data stream have been corrected using substantially all of said predetermined error detection and/or correction capability.

In a preferred embodiment of the invention, where the number of known errors (or "erasures") is equal to the number of erasures which the first error detecting and/or correcting stage is capable of correcting, the first error detecting and/or correcting stage corrects those erasures and marks the remaining symbols in the data stream or code word as erasures, and then outputs data providing an indication to the second error detecting and/or correcting stage that the known errors have been corrected using substantially all of the predetermined error detection and/or correction capability, and that the remaining symbols have been marked as erasures because there was no spare error detection and/or correction capability to check them. Such erasures may be termed "grey erasures". Thus, the plurality of error states may effectively flag the data as "good", "bad" or "grey".

The second error detection and/or correction stage initially operates on the basis that the "grey erasures" are errors. If the total number of erasures, i.e. true erasures and grey erasures, can be corrected within the predetermined error detection and/or correction capability of the second error detection and/or correction stage, then all of the erasures are processed as such and corrected as necessary. However, if the total number of erasures including the grey erasures exceeds the predetermined error detection and/or correction capability of the second error detecting and/or correcting stage, the second error correcting stage operates on the basis that the symbols marked as grey erasures are correct and corrects the true erasures, using any remaining error detection and/or correction capability to verify the remaining symbols (and correct any errors there possible)

The data is preferably interleaved, with the first error detecting and/or correcting stage processing code words formulated according to a first format and the second error detecting and/or correcting stage processing code words formulated according to a second format.

In the event that the date stream or code word includes a number of erasures which exceeds the predetermined error detection and/or corrections capability of the first error detecting and/or correcting stage, the first error detecting and/or correcting stage is preferably arranged to mark all symbols in that code word as erasures.

The error detecting and/or correcting apparatus of the present invention is beneficially included in apparatus for retrieving, decoding and playing back analogue data which has been stored on a medium, such as a tape or compact disc, in digital format.

An exemplary embodiment of the invention will now be described with reference to the accompanying drawings, in which:

DETAILED DESCRIPTION OF THE DRAWINGS

Figure 1:
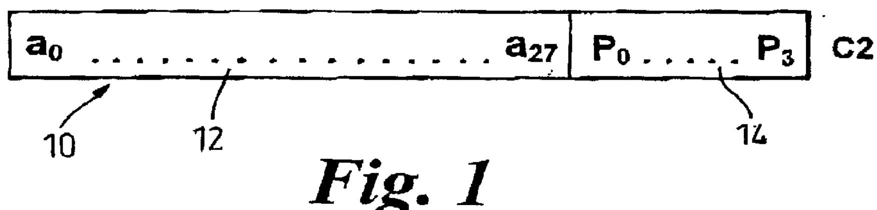
FIG. 1 is a schematic diagram of the structure of a code word.
Figure 2:
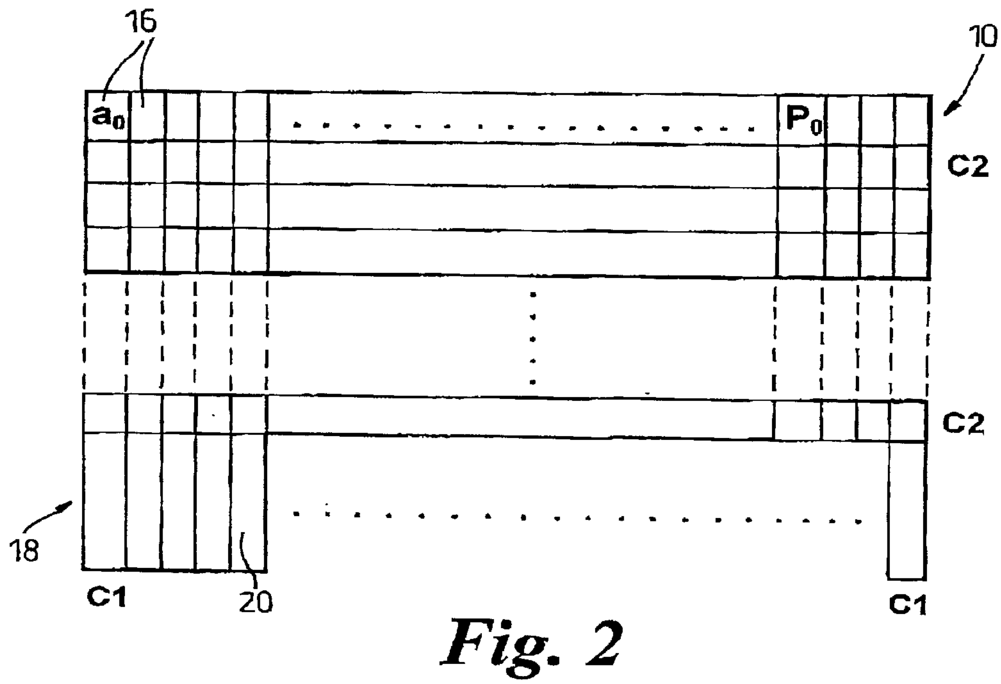
FIG. 2 is a schematic diagram illustrating the principle of interleaving.
Figure 3:
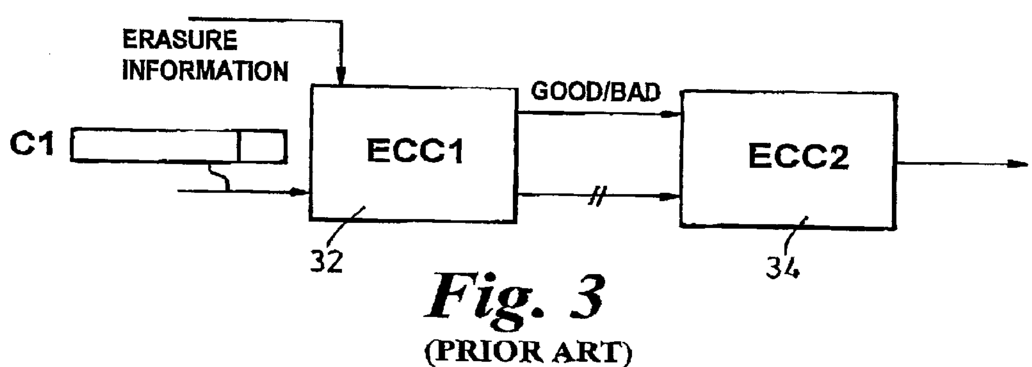
FIG. 3 is a simplified schematic block diagram of an error correction function in accordance with the prior art.
Figure 4:
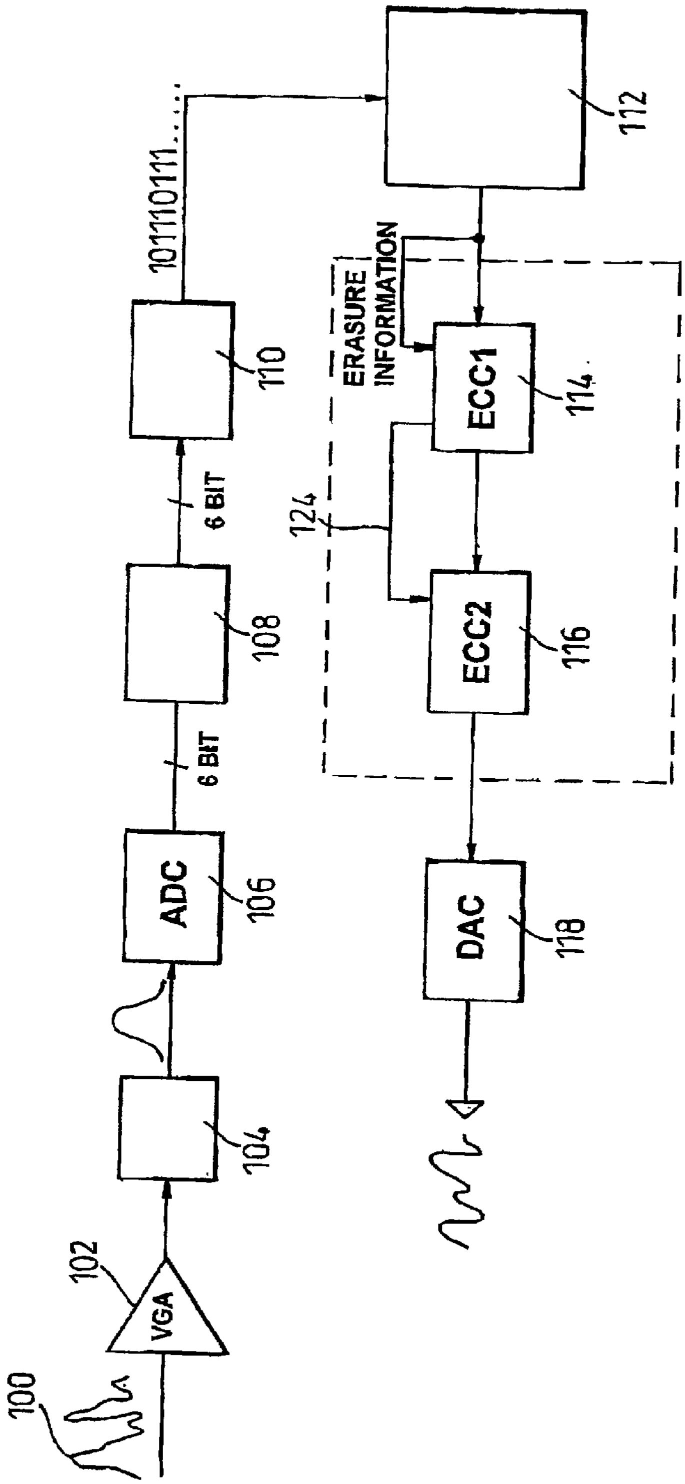
FIG. 4 is a simplified schematic block diagram of decoding circuit including an error correction module in accordance with an exemplary embodiment of the invention.

Referring to FIG. 4 of the drawings, a circuit for converting and encoding an analogue signal 100 comprises a variable gain amplifier 102, a filter 104, an analogue-to-digital converter 106, a digital signal processing circuit 108 and a Viterbi detector 110, The analogue signal 100 is amplified and then smoothed before being converted to a 6-bit digital signal. The digital signal is then encoded and written to a storage medium 112.

When data is read from the storage medium 112, it is decoded by, for example, an RLL decoder including first and second error correction modules 114, 116 (ECC1, ECC2). Once the data has been decoded and error detection/correction has taken place, the digital signal is converted to an analogue signal by the digital-to-analogue converter 118 and output.

When the digital signal is decoded, the ECC1 module 114 first identifies the symbols in each C1 code word, which are marked as erasures. These can be identified and marked during the encoding process by, for example, the Viterbi detector 110).

Figure 5:
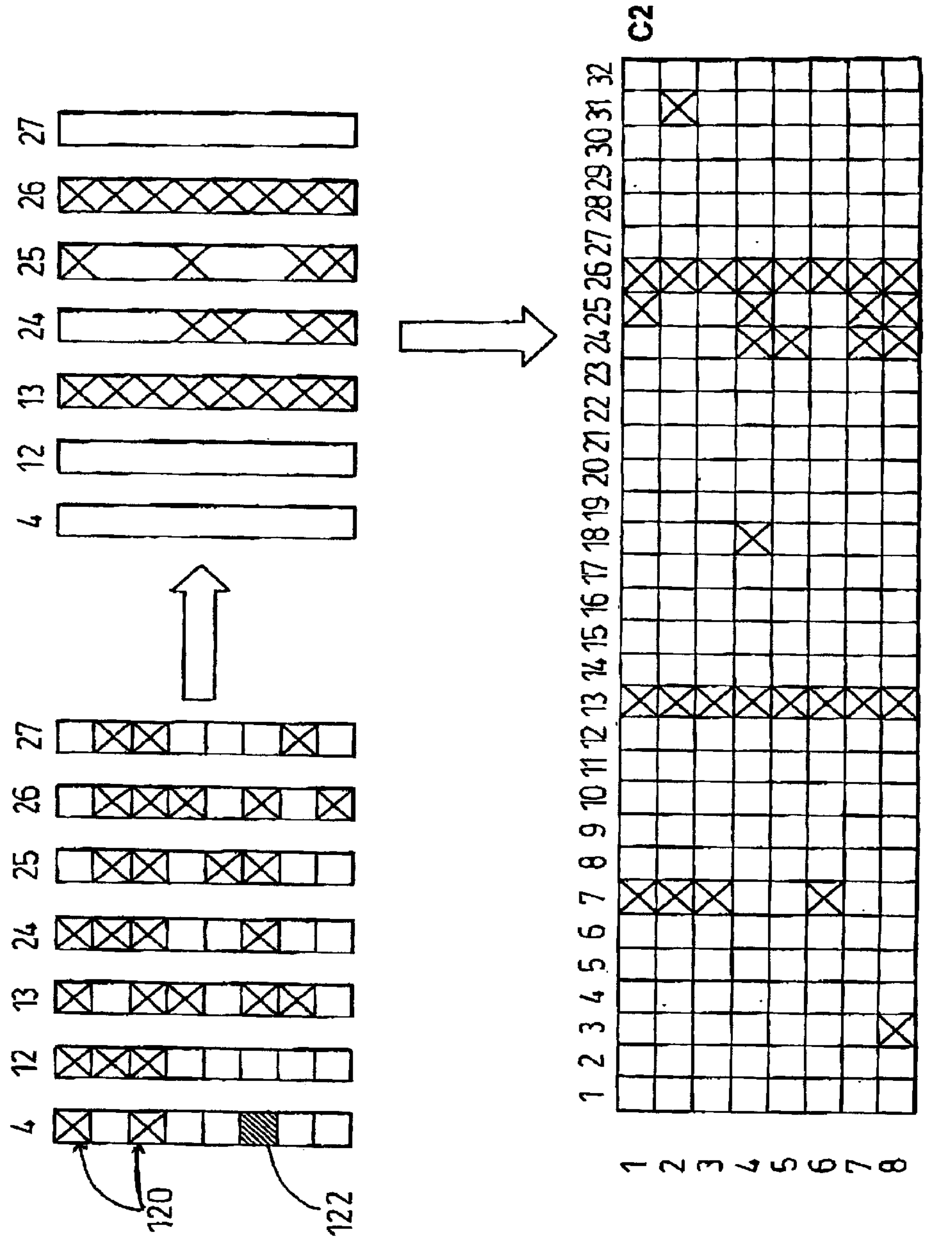
FIG. 5 is a schematic diagram illustrating the principle of operation of the error correction module included in the circuit of FIG. 4.

Referring to FIG. 5, in C1 code word 4, there are two symbols marked as erasures 120. The ECC1 module 114 uses only half of its error detection/correction capability to correct these two erasures, so it can use the other half to check the other symbols. If an error 122 is detected, the ECC1 module 114 corrects it, and the corrected code word 4 is input to the ECC2 module 116, together with a flag or other data 124 indicating that the code word 4 is "good".

In the case of code words 12 and 27, three symbols are marked as erasures Thus, the ECC1 module 114 uses only three quarters of its error detection/correction capacity to easily correct the erasures and check the remaining symbols. Thus, code words 12 and 27 are input to the ECC2 module 116 with no erasures, and the flag 124 indicating that the code word is "good".

Code words 13 and 26 each have five erasures, which cannot be dealt with by the ECC1 module 114, so the data is simply transmitted to the ECC2 module 116 with a flag 124 indicating that the code word is "bad".

Code words 24 and 25 each have four erasures, all of which can be corrected by the ECC1 module 114. However, because correction of the erasures requires all of the error detection/correction capacity, none of the other symbols can be checked. In the prior art system, the code word 24 would be transmitted to the ECC2 module 116, clear of erasures, with the flag 124 indicating that the data is "good". Although the ECC2 module would still check these symbols, it would not known which, if any, symbols might or might not be incorrect, thereby increasing the error detecting/correcting capacity required. In this exemplary embodiment of the present invention, however, the ECC1 module 114 corrects the four symbols marked as erasures and marks the remaining symbols as erasures before transmitting the code word to the ECC2 module 116 together with a flag 124 indicating that the data is "grey", i.e. it may be correct or not. Thus, the ECC2 module 116 knows the locations of potential errors.

The C2 code words shown in FIG. 5 contain four or less erasures, except code words 4 and 8. Thus, in this case, all C2 code words can be corrected by the ECC2 module 116, except code words 4 and 8.

In the case of code word 4, the erasures in columns 24 and 25 are "grey erasures". Similarly, in code word 8, the erasures in columns 24 and 25 are "grey erasures". The grey erasures in all of the other C2 code words are presumed to be true erasures because the error correction capacity in the ECC2 module 116 is sufficient to correct all of the erasures without discrimination. Code words 4 and 8, however, have five erasures (including two "grey" erasures each). Thus, the ECC2 module 116 instead treats the symbols marked as "grey erasures" as being correct (which is most likely anyway), leaving Just three erasures, which can be corrected by the ECC2 module 116.

Thus, in summary, the concept of "grey" erasures is intended to improve an error correction process, without increasing the amount of ECC (Error correction code) redundancy (parity symbols) required.

Each error correction codeword consists of a sequence of symbols, some of which are redundant.

An "erasure" is the term used to describe the case where the ECC process has been alerted that a specific symbol is likely to be incorrect. An "error", on the other hand, is where a symbol is incorrect, but the ECC process has not been altered.

When an error occurs, the ECC scheme has to locate the error (i.e. identify which symbol is bad) and then correct it. When an erasure occurs, the location is already known, and so the error correction process only needs to correct it. Therefore the ECC scheme is able to correct erasures more easily than errors.

In prior art systems, each symbol is either an erasure, or is not an erasure, i.e. is either assumed to be good, or bad. The concept of 'grey' erasures increases this to 3 or more levels. A symbol can be good, bad, or somewhere in between. These added levels provide more information to the ECC scheme, thus improving the correction process.

In the described example, there are 2 stages of error correction. If the first ECC stage is unable to correct the data, the codeword is considered bad, i.e. all symbols are flagged as erasures to the second ECC stage. If the first ECC stage is able to correct the codeword easily, without using all of the available redundancy, or the codeword did not require correction, then the codeword is considered good. All symbols are NOT erasures. This is typical of existing systems.

However, in the present invention, if the first ECC stage is only able to correct the codeword by using the full error correction power, then the codeword is considered to be grey. The symbols are grey erasures. The codeword has a good chance of being correct, but has a higher probability of being incorrect than codewords, which were easily corrected.

These are flagged as grey erasures to the second ECC stage. In the second ECC stage, first of all the grey erasures are treated as true erasures, i.e. potentially bad. If it is able to correct the codeword using this assumption then it does.

However, if there are too many erasures to be corrected, then the second ECC scheme now has a second attempt at correction, this time assuming that the grey erasures are not erasures, i.e. these symbols are good.

Without the concept of grey erasures, then these grey erasures would either have been considered good, or bad. If they were considered bad then there is an increased risk of there being too many erasures for the second ECC stage to correct the codeword. If however they are considered good, then there is a risk that they are actually bad, which also increases the risk of the second stage being unable to correct the codeword. The concept of grey erasures aims to get the best of both of these alternatives.

Therefore, using this scheme, the data is more likely to be corrected than with simple boolean erasure flags used in prior art systems.

While a particular embodiment of the present invention has been shown and described in detail herein, it may be obvious to those skilled in the art that changes and modifications of the present invention in its various aspects, may be made without departing from the invention in its broader aspects, some of which changes and modifications being matters of routine engineering or design, and others being apparent after study. As such, the scope of the invention should not be limited by the particular embodiments and specific constructions described herein, but should be defined by the appended claims and equivalents thereof.

Accordingly, the aim of the appended claims is to cover all such changes and modifications as fall within the true scope of the invention.

What is claimed is:

1. Apparatus for detecting and/or correcting data encoded into first and second codewords using a first error correction code and second error correction code, respectively, each of said first d second error correction codes having a predetermined error and/or erasure detecting an r correcting capability relayed to the numbers of errors, of unknown location, and erasures, of known location, that can corrected in a respective first or second codeword, each of the codewords comprising a respective predetermined number of symbols or elements, said apparatus comprising:

a first error detecting and/or correcting stage arranged to receive a stream of first codewords and to apply error detection and/or correction to errors and/or erasures in said first codewords;

a second error detecting and/or correcting stage for receiving second codewords derived from the output from said first error detecting and/or correcting stage and applying error detection and/or correction to errors and/or erasures in said second codewords, wherein, for each first codeword, said first error detecting and/or correcting stage outputs to said second error detecting and/or correcting stage data indicative of an error state depends on the error detecting and/or correcting capability of said first error correction code and the number of actual errors an erasures corrected in said first codeword, said error state being one of at least three possible states comprising a "bad" state indicating that the codeword is bad, at least one "intermediate" state indicating that the codeword is of intermediate quality, and a "good" state indicating that the codeword is good, and said second error detecting and/or correcting stage is operable to use the data indicative of said error state provided by said first error detecting and/or correcting stage to identify, as being of an intermediate state, selected symbols or elements in said second codewords which are derived from a first codeword indicated as having an intermediate state.

2. Apparatus according to claim 1, wherein the first error detecting and/or correcting stage is arranged for marking the remaining elements or symbols in said codeword as erasures in response to all known errors and/or erasures in codeword having been corrected using substantially all of said predetermined error and/or erasure detection and/or correction capability.

3. Apparatus according to claim 2, wherein said second error detecting and/or correcting stage is arranged such that if the total number of known errors in a codeword, including one or more of said remaining elements or symbols marked as erasures by the first error detecting and/or correcting stage, can be corrected by the second error detecting and/or correcting stage within its predetermined error and/or erasure detection and/or correction capability, all such errors and erasures are processed, verified and corrected as necessary.

4. Apparatus according to claim 2, wherein said second error detecting and/or correcting stage is arranged such that in response to the total number of error and erasures in a codeword, including said remaining elements or symbols marked as erasures by said first error detecting and/or correcting stage being greater than the number of errors and erasures which can be corrected within the error detection and/or correction capability of said second correcting stage, said remaining elements or symbols marked as potential erasures by the first error detecting and/or correcting stage are considered to be correct, said second error detecting and/or correcting stage being further arranged to correct the known erasures and to detect and correct any errors in the codeword using any remaining error detection and/or correction capabilities.

5. Apparatus according to claim 1, wherein said data is interleaved.

6. Apparatus according to claim 1, wherein said first error detecting and/or correcting stage is arranged to mark all symbols in said codeword errors in response to a codeword including a number of errors which exceeds the predetermined error detection and/or correction capability of said first error detecting and/or correcting stage.

7. Apparatus for retrieving, decoding and playing back analogue data which has been stored on a medium such as a tape, in digital format, including apparatus according to claim 1.

8. A math of detecting and/or correcting data encoded into first and second codewords using a first or correction code and a second error correction code, respectively, each of said first and second error correction codes having a predetermined error and/or erasure detecting and/or correcting capability related to the number of errors, of unknown location, and erasures, of known location, that can be corrected in a respective first or second codeword, each codeword comprising a respective predetermined number of symbols or elements, said method comprising:

inputting a stream of first codewords into a first error detecting and/or correcting stage that applies error detection and/or correction to errors and/or erasures is said first codewords, deriving second codewords from the output of said first error detecting and/or correcting stage, applying said second codewords to a second error detecting and/or correcting stage that applies an error detection and/or correction process to errors and/or erasures in said second codewords, wherein, for each first error correction codeword, said first error detecting and/or correcting stage outputs to said second error detecting and/or correcting stage date indicative of an error state dependent on the basis of the error detecting and/or correcting capability of said first error correction codes and the numbers of actual errors and erasures corrected in said first codewords, said error state being one of at least three possible states comprising a "bad" state indicating that the codeword is bad, at least one "intermediate" state indicating that the codeword is of intermediate quality and a "good" state indicating that the codeword is good, and said second error detecting and/or correcting stage using the error state provided by said first error detecting and/or correcting stage to identify as being of intermediate state selected symbols or elements in said second codewords corresponding to symbols or elements in each first codeword indicated as having an intermediate state.

9. A method according to claim 8, wherein said first error detecting and/or correcting stage corrects said known errors and marks the remaining symbols in said codeword as erasures in response to the number of errors and/or erasures being equal to the number of errors corresponding to a limit which said first error detecting and/or correcting stage can correct within said predetermined error detection an or correction capability.

10. A method according to claim 9, wherein said second error correcting stage corrects said errors and erasures in response to the total number of errors and/or erasures in a codeword input to said second error detecting and/or correcting stage, including said remaining symbols marked as erasures by said first error detecting and/or correcting stages, is such that the errors and/or erasures can all be corrected by said second error correcting stage within its predetermined error detection and/or correction capability.

11. A method according to claim 9, wherein said second error correcting stage carries out its error correction process on the basis that said remaining symbols are correction in response to the number of erasures and/or errors in a codeword input to said second error correcting stage, including said remaining symbols marked as erasures by said first error detecting and/or correcting stage, exceeding a limit which can be corrected by the second error correcting stage within its redetermined error detection and/or correction capability.

12. A method according to claim 9, wherein said data is interleaved.

13. A method according to claim 9, wherein said first error detecting and/or correcting stage marks all symbols in said codeword as errors in response to number of known erasures in a codeword exceeding the redetermined error detection and/or correction capability of said first error detecting and/or correcting stage.

14. Apparatus for detecting and/or correcting data encoded into first and second codewords using a first error correction code and a second error correction code, respectively, each of said first an second error correction codes having a predetermined error and/or erasure detecting and/or correcting capability related to the numbers of errors, of unknown location, and erasure, of known location, that can be corrected in a respective first or second codeword, each of the codewords comprising a respective predetermined number of symbols or elements, said apparatus comprising:

a first error detecting and/or correcting stage arranged to receive a stream of first codewords and to apply error detection and/or correction to errors and/or erasures in said first codewords;

a second error detecting and/or correcting stage for receiving second codewords derived from the output of said first error detecting and/or correcting stage and for applying error detection and/or correction to errors and/or erasures in said second codewords, wherein, for each first codeword, said first error detecting and/or correcting stage is arranged to determine data indicative of an error state dependent on the error detecting and/or correcting capability of said first or correction code and the numbers of actual errors and erasures corrected in said first codeword, said error state being one of at least three possible states comprising a "bad" state indicating that the number of errors and erasures in a respective first codeword exceeds the error detecting and/or correcting capability of said first error correcting code, an "intermediate" state indicating that all known errors and erasures in the codeword have been corrected using substantially all of said error detecting and/or correcting capability, and a "good" state indicating that there are no known errors or erasures in the codeword or that all errors an erasures in the codeword have been corrected using less than said error detecting and/or correcting correction capability, each first codeword of intermediate state being marked such that unchecked symbols or elements of said codeword not checked in said first error detecting and/or correcting stage are marked as erasures for said second error detecting and/or correcting stage.

15. A method of retrieving, decoding and playing back analogue data which has been stored on a medium, such as a tape or compact disc, in digital format, including the method of claim 14.

16. A method of detecting and/or correcting data encoded into first and second codewords, respectively having a first error correction code and a second error correction code, each of said first second error correction codes having a predetermined error and/or erasure detecting and/or correcting capability related to the number of errors, of unknown location, and erasures, of known location, that can be corrected in a respective first or second codeword, each codeword comprising a respective predetermined number of symbols or elements, said method comprising:

detecting and/or correcting a stream of first codewords by applying a first error detection and/or correction process to errors and/or erasures in said first codewords;

deriving second codewords from the stream of first codewords, said second codewords being derived on the basis of the first process;

applying a second error detecting and/or correction process to errors and/or erasures in said second codewords;

deriving for each second codeword data indicative of an error state dependent on the basis of the error detecting and/or correcting capability of said first error correction codes and the numbers of actual errors and erasures in said second codewords, said error state being one of at least three possible states including a "bad" state indicating that the second codeword is bad, at least one "intermediate" state indicating that the second code word is of intermediate quality, and a "good" state indicating that the second codeword is good; and identifying as being of intermediate state selected symbols or elements in said second codewords corresponding to symbols or elements in each first codeword indicated as having an intermediate state by using the error state provided by said first process.

17. A method of detecting and/or correcting data encoded into first and second codewords, respectively having a first error correction code and a second error correction code, each of said first and second error correction codes having a predetermined error and/or erasure correcting capability related to the number of errors, of unknown location, and erasures, of known location, that can be corrected in a respective first or second codeword, each codeword comprising a respective predetermined number of symbols or elements, said method comprising:

correcting a stream of first codewords by applying a first error detection and/or correction process to errors and/or erasures in said first codewords;

deriving second codewords from the stream of first codewords, said second codewords being derived on the basis of the first process;

applying a second error correction process to errors and/or erasures in said second codewords;

deriving for each second codeword an indication of an error state dependent on the basis of the error correcting capability of said first error correction codes and the numbers of actual errors and erasures in said second codewords, said error state being one of at least three possible states including a "bad" state indicating that the second codeword is bad, at least one "intermediate" state indicating that the second code word is of intermediate quality, and a "good" state indicating that second codeword is good; and identifying as being of intermediate state selected symbols or elements in said second codewords corresponding to symbols or elements in each first codeword indicated as having an intermediate state by using the error state provided by said first process.

18. Apparatus for detecting and correcting data encoded into first and second codewords using a first error correction code and a second error correction code, respectively, each of said first a second error correction codes having a predetermined error and/or erasure detecting and correcting capability related to the numbers of errors, of unknown location, and erasures, of known location, that can be corrected in a respective first or second codeword, each of the codewords comprising a respective predetermined number of symbols or elements, said apparatus comprising:

a first error detecting an correcting stage arranged to receive a stream of first codewords and to apply error detection and correction to errors and/or erasures in said first Codewords;

a second error detecting correcting stage for receiving second codewords derived from the output of said first error detecting and correcting stage and applying error detection and correction to errors and/or erasures in said second codewords, wherein, for each first codeword, said first error detecting and correcting stage outputs to said second error detecting and correcting stage data indicative of an error state dependent on the error detecting and correcting capability of said first error correction code and the number of actual errors an erasures corrected in said first codeword, said error state being one of at least three possible states comprising a "bad" state indicating that the codeword is bad, at least one "intermediate" state indicating that the codeword is of intermediate quality, and a "good" state indicating that the codeword is good, and said second error detecting and correcting stage being operable to use the data indicative of said error state provided by said first error detecting and correcting stage to identify as being of an intermediate state selected symbols or elements in said second codewords which are derived from first codeword indicated as having an intermediate state.

19. A method of detecting and correcting data encoded into first and second codewords using a first error correction code and a second error correction code, respectively, each of said first an second error correction codes having a predetermined error and/or erasure detecting an correcting capability related to the number of errors, of unknown location, and erasures, a known location, that can be corrected in a respective first or second codeword, each codeword comprising a respective predetermined number of symbols or elements, said method comprising:

inputting a stream of first codewords into a first error detecting and correcting stage to apply error detection and/or correction to errors and/or erasures in said first codewords, deriving second codewords from the output from said first error detecting and correcting stage, applying said second codewords to a second error detecting and correcting stage to apply an error detection and correction process to errors and/or erasures in said second codewords, wherein, for each first error correction codeword, said first error detecting and correcting stage outputs to said second error detecting and correcting stage data indicative of an error state dependent on the basis of the error detecting and correcting capability of said first error correction codes and the numbers of actual errors and erasures corrected in said first codewords, said error state being one of at least three possible states comprising a "bad" state indicating that the codeword bad, at least one "intermediate" state indicating that the codeword is of intermediate quality, and a "good" state indicating that the codeword is good, and said second error detecting and correcting stage using the error state provided by said first error detecting and correcting stage to identify as being of intermediate state selected symbols or elements in said second codewords corresponding to symbols or elements in each first codeword indicated as having intermediate state.

20. Apparatus for detecting and correcting data encoded into first and second codewords using a first or correction code and a second error correction code, respectively, each of said first d second error correction codes having a predetermined error and/or erasure detecting an correcting capability related to the numbers of errors, of unknown location, and erasures, of known location, that can be corrected in a respective first or second codeword, each of the codewords comprising a respective predetermined number of symbols or elements, said apparatus comprising:

a first error detecting an correcting stage arranged to receive a stream of first codewords and to apply error detection and/or correction to errors and/or erasures in said first codewords;

a second error detecting an correcting stage for receiving second codewords derived from the output of said first error detecting and correcting stage and to apply error detection and/or correction to errors and/or erasures in said second codewords, wherein, for each first codeword, said first error detecting and correcting stage determines data indicative of an error state dependent on the error detecting and correcting capability of said first error correction code and the numbers of actual errors and erasures corrected in said first codeword, said error state being one of at least three possible states comprising a "bad" state indicating at the number of errors and erasures in a respective first codeword exceeds the error detecting and correcting capability of said first error correcting code, an "intermediate" state indicating that all known errors and erasures in the codeword have been corrected using substantially all of said error detecting and correcting capability, and a "good" state indicating that there are no known errors or erasures in the codeword or that all errors and erasures in the codeword have been corrected using less than said error detecting and correcting correction capability, marking each first codeword d of intermediate state such that unchecked symbols or elements of said codeword not checked in said first error detecting and correcting stage are marked as erasures for said second error detecting and correcting stage.

* * * * *